United States Patent [19]
Harwood, III

[11] Patent Number: 5,142,688
[45] Date of Patent: Aug. 25, 1992

[54] DATA PROCESSOR TEST MODE ACCESS METHOD

[75] Inventor: Wallace B. Harwood, III, Austin, Tex.

[73] Assignee: Motorola, Inc., Schaumburg, Ill.

[21] Appl. No.: 431,121

[22] Filed: Nov. 3, 1989

[51] Int. Cl.$^5$ ............................................ G06F 11/22
[52] U.S. Cl. .................... 395/800; 364/259.6; 364/260.8; 364/263.3; 364/264.5; 364/DIG. 1; 371/15.1; 395/575
[58] Field of Search ............ 395/575, 500, 800; 371/15.1, 16.1

[56] References Cited
U.S. PATENT DOCUMENTS

| | | | |
|---|---|---|---|
| 4,359,771 | 11/1982 | Johnson et al. | 371/13 |
| 4,580,246 | 4/1986 | Sibigtroth | 365/189 |
| 4,669,059 | 5/1987 | Little et al. | 395/750 |
| 4,796,235 | 1/1989 | Sparks et al. | 365/228 |
| 5,012,180 | 4/1991 | Dalrymple et al. | 324/73.1 |

*Primary Examiner*—Thomas C. Lee
*Assistant Examiner*—Ayni Mohamed
*Attorney, Agent, or Firm*—Robert L. King

[57] ABSTRACT

A data processor has a test mode which may be selectively accessed for either production testing of the processor or user testing from an external control signal. To enter the test mode, both an external signal applied to an integrated circuit package pin of the data processor and a register bit must be asserted. If only the register bit is asserted, the special mode cannot be entered until the data processor has been reset again.

9 Claims, 3 Drawing Sheets

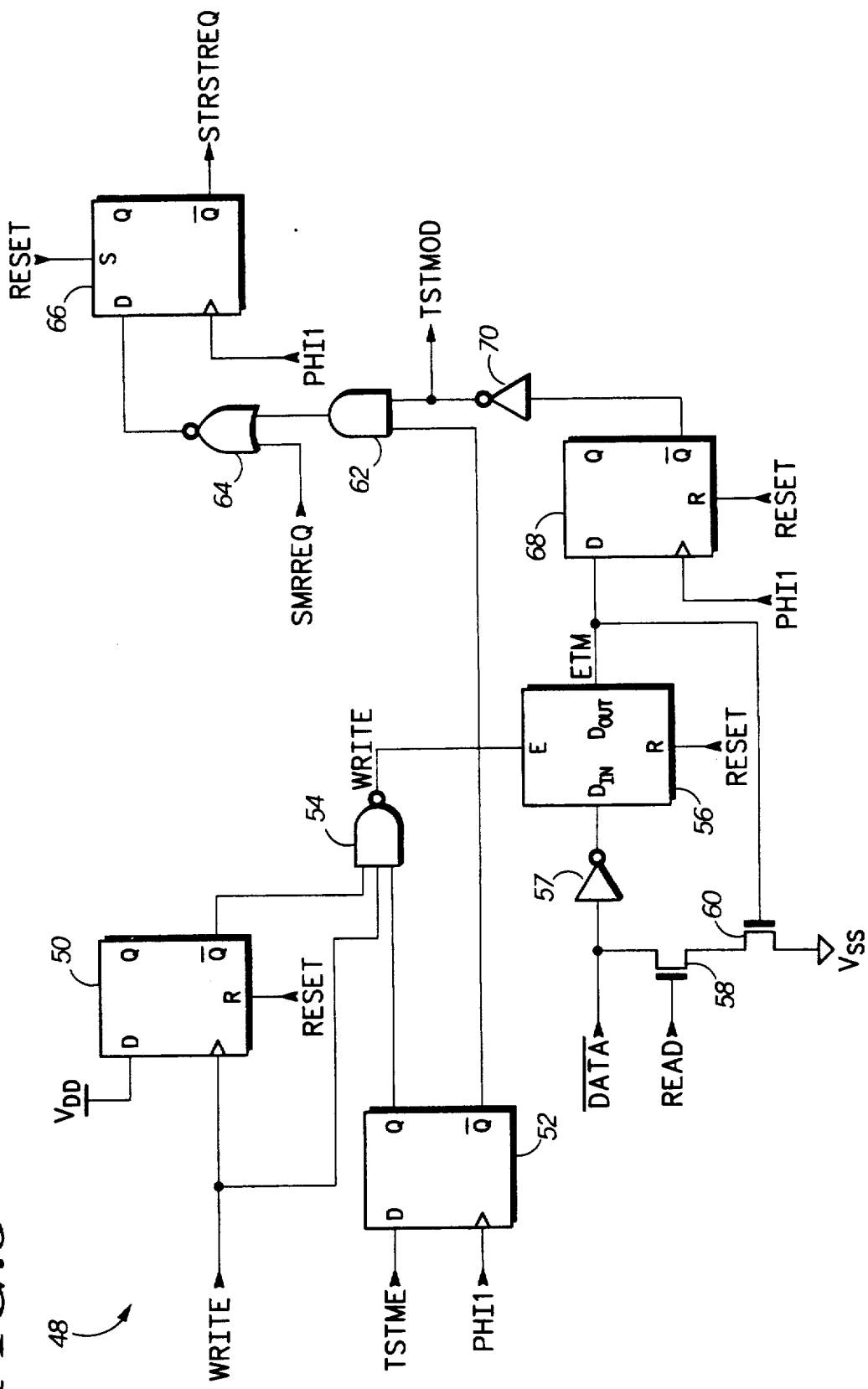

DATA PROCESSOR TEST MODE ACCESS METHOD

FIELD OF THE INVENTION

This invention relates to microcomputers which have a special mode of operation, and more specifically to control enabling the special mode.

BACKGROUND OF THE INVENTION

Data processors often have special modes of operation in order to gain access to special features that should not be accidentally enabled. An example of such a special mode is a "test mode". In a test mode, various test features can be enabled which may alter the normal function of various sections within the data processor. The altered functionality of the sections improves testability but often precludes normal processor operation. If a test mode is inadvertently enabled during normal operation, a catastrophic system failure may occur.

Several methods have been used to restrict access to special modes in a data processor. These include:

1) Enabling a special mode when a predetermined voltage is applied to a dedicated pin of an integrated circuit containing the data processor.
2) Enabling a special mode when a multipurpose pin of an integrated circuit detects a voltage level outside a normally expected operating voltage range. A microprocessor labeled the "MC68000" sold by Motorola Inc. senses a higher than normal voltage signal on a pin to initiate certain test features.
3) Enabling a special mode when a predetermined pin of an integrated circuit is asserted during the negation of a reset mode as performed by a data processor labeled the "MC68HC05" sold by Motorola Inc..
4) Enabling a special mode via a register bit which can only be written once after resetting the data processor. This enabling mechanism is performed by a data processor labeled the "MC68HC11" sold by Motorola Inc. and is described in U.S. Pat. No. 4,580,246 by James M. Sibigtroth and assigned to the assignee hereof.
5) Enabling a special mode via a register bit which can only be negated once after resetting the data processor. This enabling mechanism is also performed by the MC68HC11 data processor.
6) Enabling a special mode via a register bit which can only be written within a specified time period following resetting the data processor. This enabling mechanism is also performed by the MC68HC11 data processor.

In a data processing system, a user may also desire that special modes of a data processor be secure and yet software controllable. However, additional and unforeseen ways of accidentally entering a special mode may exist when software control exists.

SUMMARY OF THE INVENTION

It is an object of the present invention to provide an improved data processor test mode access method.

It is a further object of this invention to provide an improved data processor which is user controlled for enabling a special mode of operation.

In carrying out the above and other objects of the present invention there is provided a method and apparatus in a data processor which can selectively place the data processor in a special mode of operation. A terminal of the data processor is provided for receiving a predetermined external signal required to enter the special mode. A mode signal is selectively provided for controlling when the special mode is entered in response to both a control signal provided by the data processor and the external signal. The mode signal is only provided in response to both a first time the control signal is asserted between an assertion of successive reset signals of the data processor and if the external signal is also asserted. The special mode is otherwise prevented from being entered by the mode circuitry so that subsequent assertions of the control signal by the data processor before a reset occurs cannot result in the mode signal being provided.

These and other objects, features and advantages, will be more clearly understood from the following detailed description taken in conjunction with the accompanying drawings.

BRIEF DESCRIPTION OF THE DRAWINGS

FIG. 3 is a partial schematic diagram which implements the test mode enabling mechanism of FIG. 2.

DETAILED DESCRIPTION OF THE INVENTION

The terms "assert" and "negate", and various grammatical forms thereof, are used herein to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

Figure 1:
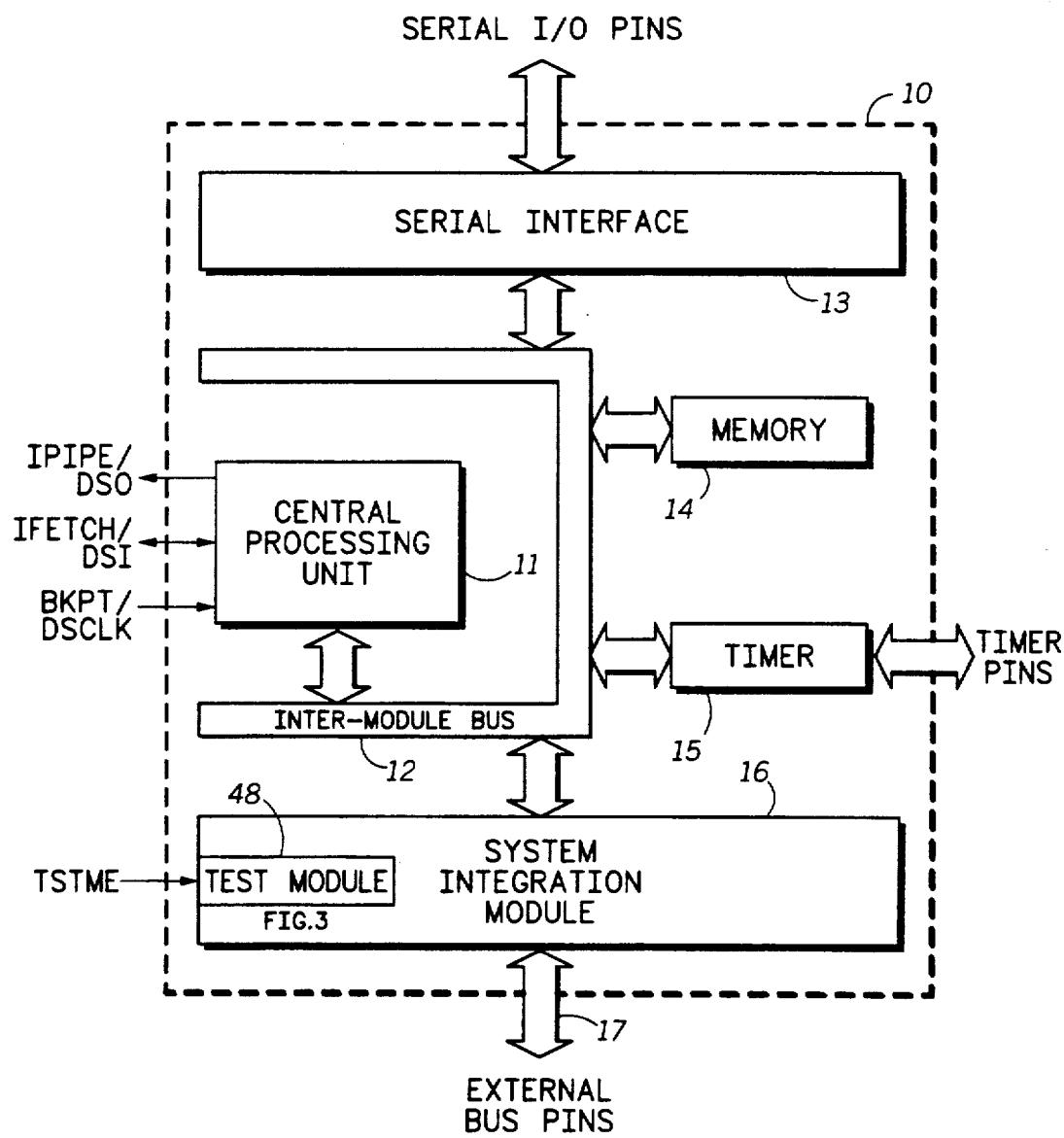
FIG. 1 is a block diagram of an integrated circuit data processor in accordance with the present invention.

FIG. 1 illustrates a data processor 10 which embodies the present invention. Data processor 10, which is intended for manufacture as a single integrated circuit, comprises a central processing unit (CPU) 11, an intermodule bus (IMB) 12, a serial interface 13, a memory module 14, a timer 15 and a system integration module (SIM) 16. Each of CPU 11, serial interface 13, memory 14, timer 15 and SIM 16 is considered a circuit module and is bi-directionally connected to IMB 12 for the purpose of exchanging address, data and control information.

Serial interface 13 and timer 15 are each coupled to a number of external pins, or connectors, for communication with devices external to data processor 10. In addition, SIM 16 is coupled to a number of external pins via an external bus 17 and to power supply and crystal oscillator pins. SIM 16 provides a mechanism for interfacing IMB 12 to the external bus 17 so that CPU 11 can access external memory or peripheral devices. SIM 16 also provides a mechanism for interfacing external bus 17 to IMB 12 so that an external bus master (not shown) may access internal circuitry of data processor 10. This external bus 17 to IMB 12 interfacing is hereinafter referred to as "slave mode".

In operation, the SIM 16 contains a test submodule of which the enable test mode module circuit 48 is a part. The test submodule supports both production testing and user self-test for data processor 10. The test submodule performs scan based testing of various circuitry within the system, and accesses the circuitry via signal lines of IMB 12. Various features and operations of the test submodule are restricted to operate only while in test mode. Scan based testing involves serially scanning data through various "scan paths" within a circuit module in order to more easily test internal circuitry. Scan paths are designed to provide additional control and visibility of complicated circuitry making it more easily tested as compared to just performing functional tests. This improved ease of testability improves fault detection and reduces test time, thus improving quality and reducing costs.

Each circuit module incorporates a "test register" (not shown) which is writeable only while in a test mode, as controlled by a test mode signal discussed below provided by SIM 16. Each test register is typically written to prior to testing the module. The test register selects which scan paths to use and any additional test functions which are enabled during testing. Each test register can be written to, while in test mode, by any master of IMB 12 including the CPU 11 (i.e. for self-test) or an external master via slave mode (i.e. for production testing or self-test under the direction of an external device).

As mentioned previously, testing operations are allowed only when data processor 10 is in a test mode. The test mode is controlled by an enable test mode (ETM) register bit in SIM 16. Access to this ETM register bit is restricted in that it can only be written to once following reset, and the bit can be asserted only if the external test mode enable pin (TSTME) is asserted. Furthermore, if while in test mode the TSTME pin becomes negated, a reset occurs which effectively brings the system to its normal, non-test mode operating state. The ETM bit is coupled as a TSTMOD signal to IMB 12 and notifies other modules as to the status of test mode.

Figure 2:
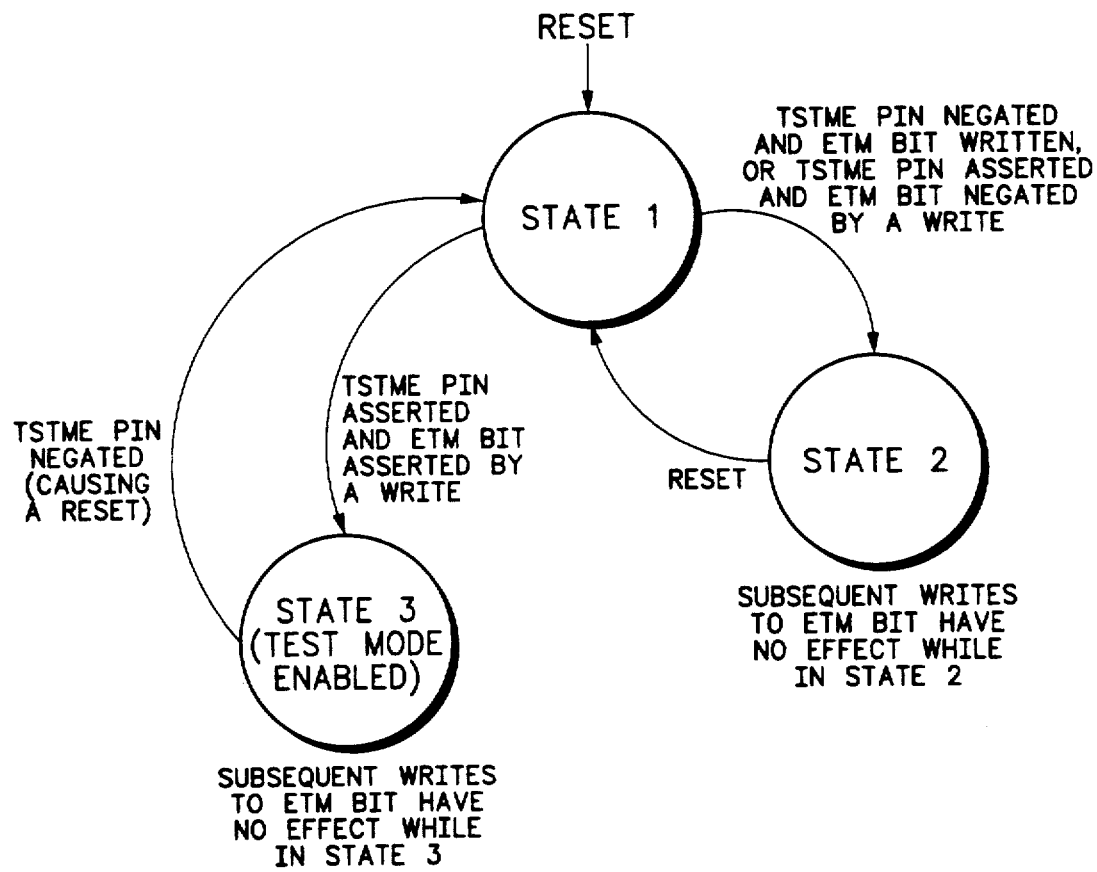
FIG. 2 is a state diagram of a test mode enabling mechanism of the present invention.

FIG. 2 depicts a state diagram 20 illustrating the present invention. State diagram 20 is presented simply as an aid for describing the invention and does not necessitate that the invention be implemented as a state machine. In FIG. 2, state one is the initial state, and is entered whenever reset is asserted. While in state one, if the ETM bit is written to (regardless of writing to asserted or negated state) while the TSTME pin is negated, or if the ETM bit is written to its negated state while the TSTME pin is asserted, then state two is entered. While in state two, the ETM bit remains negated and subsequent writes to the ETM bit have no effect. The assertion of reset is the only way of exiting state two and causes a transition back to state one. While in state one, if the ETM bit is written to its asserted state while the TSTME pin is asserted then the ETM bit is asserted, the test mode is enabled, and the requisite IMB 12 test mode signals are asserted. While in state three, the ETM bit remains asserted and subsequent writes to the ETM bit have no effect. While in state three, if the TSTME pin is negated, a reset operation occurs and state one is entered.

FIG. 3 is a logic diagram of test mode module circuit 48 implementing the inventive ETM bit. As an introduction, a description of the signals coming into and going out of test mode module circuit 48 is given.

WRITE—is the general write enable signal for the test register

READ—is the general read enable signal for the test register

DATA—is a signal conductor of a general data bus internal to SIM 16.

This data bus routes data that is to be read from or written to registers throughout SIM 16.

TSTME—is a signal derived from the external TSTME terminal pin.

PHI1—is a free running clock signal of predetermined frequency.

RESET—is equivalent to the global reset signal of the microprocessor.

SMRREQ—is a reset request generated by a state machine within the test submodule of SIM 16. This signal is driven at the conclusion of a "self test" feature of the test submodule to reset the system.

STRSTREQ—is a reset request signal from the test submodule of SIM 16 requesting that SIM 16 cause a system wide reset.

TSTMOD—is the test mode signal that is sent to SIM 16 and to other modules within the microprocessor.

A D-latch 50 has a first input labeled "D" connected to a power supply voltage terminal for receiving a power supply voltage labeled $V_{DD}$. A second input of D-latch 50 is connected to the WRITE signal. A reset terminal of D-latch 50 is connected to the RESET signal. A D-latch 52 has a first input also labeled "D" connected to the TSTME signal, a second complement input connected to clock signal PHI1, a first output labeled "Q" connected to a first input of a NAND gate 54, and a second complement output. A second input of NAND gate 54 is connected to the WRITE signal, and a third input of NAND gate 54 is connected to a complement Q output of D-latch 50. An output of NAND gate 54 provides a modified write enable signal labeled WRITE and is connected to a clock enable input labeled "E" of a latch 56. A data input of latch 56 labeled "$D_{IN}$" is connected to the output of inverter 57. The input of inverter 57 is connected to the $\overline{DATA}$ signal and to a first current electrode of a transistor 58. A gate of transistor 58 is connected to the READ signal, and a second current electrode of transistor 58 is connected to a first current electrode of transistor 60. A second current electrode of transistor 60 is connected to a power supply voltage terminal for receiving a power supply voltage labeled $V_{SS}$. The second complement output of D-latch 52 is connected to a first input of an AND gate 62. A second input of AND gate 62 is connected to the TSTMOD signal. An output of AND gate 62 is connected to a first input of a NOR gate 64. A second input of NOR gate 64 is connected to the SMRREQ signal. An output of NOR gate 64 is connected to a first data input labeled "D" of a D-latch 66. A second input of D-latch 66 is connected to clock signal PHI1. The RESET signal is connected to a set input S of D-latch 66. A complement Q output of D-latch 66 provides the STRSTREQ signal. A gate of transistor 60 and a data output labeled $D_{OUT}$ of latch 56, which provides a enable test mode (ETM) bit, are connected together and to a data input labeled "D" of a latch 68. A clock input of latch 68 is connected to clock signal PHI1, and the RESET signal is connected to a reset input R. A complement Q output of latch 68 is connected to an input of an inverter 70. An output of inverter 70 is connected to a second input of AND gate 62 and provides the TSTMOD signal.

In operation, on the occurrence of the RESET signal, D-latch 50 is set so that Q=0 and $\overline{Q}$=1. At the conclusion of the first write enable signal for the test register, the D-latch 50 is clocked by the negation of the WRITE signal, causing a logic one to be latched and $\overline{Q}$ to become a logic zero. The TSTME signal is synchronized by D-latch 52 which is clocked by the PHI1 clock. It should also be apparent that the TSTME signal may be buffered from an input pin before being connected to test mode module circuit 48. Synchronization with the clock signal helps prevent invalid signal levels or glitches from causing metastability in internal logic circuitry. The output of NAND gate 54 (the WRITE signal) is asserted only when: (1) WRITE is asserted, (2) TSTME is asserted, and (3) only for the first assertion of the WRITE signal following the assertion of the RESET signal. This WRITE signal is coupled to the enable (E), or load, input of latch 56 such that when WRITE is asserted, the inverted value of the $\overline{DATA}$ signal is latched. Latch 56 is set to a logic zero at the occurrence of reset in order to negate test mode.

When a read cycle occurs, the READ signal is asserted which drives the gate of transistor 58 and couples the $\overline{DATA}$ signal line to transistor 60. The output of latch 56 (ETM) drives the gate of transistor 60 which couples the $\overline{DATA}$ signal line through transistor 58 and transistor 60 to supply voltage $V_{SS}$ in order to discharge the $\overline{DATA}$ signal line if the latched data value is a logic one. The $\overline{DATA}$ signal line operates in a precharge/discharge manner with precharging being handled elsewhere in SIM 16. The output of latch 56 is passed through latch 68 which is clocked by the PHI1 clock and functions as a synchronizer. The output of latch 68 is buffered by inverter 70 to provide enhanced signal drive for the TSTMOD signal. This signal is then coupled to the TSTMOD signal conductor of IMB 12 which is routed to all the modules of data processor 10.

Since the $\overline{Q}$ output of D-latch 52 and signal TSTMOD are coupled to the inputs of AND gate 62, the output of AND gate 62 is asserted when TSTME is negated and TSTMOD is asserted. Since the output of AND gate 62 is NORed by NOR gate 64 with another reset request signal, SMRREQ, the resulting signal is passed through latch 66 clocked by the PHI1 clock. Latch 66 functions as a synchronizer to synchronize the reset request signal to the PHI1 clock signal. The output of latch 66 is the STESTREQ signal which is coupled to reset logic (not shown) of SIM 16 and causes a reset to occur.

By now it should be apparent that there has been provided a circuit which allows a bit, the ETM bit, to be written only once following reset and to be asserted only if the external TSTME pin is asserted. The circuit also provides for a reset to be caused if the TSTME pin is negated while the ETM bit is asserted. The ETM bit is coupled to the TSTMOD signal of IMB 12 which is used to enable test mode throughout the microprocessor. The present invention provides a user with easy access to a test mode and also improves the ability to accomplish testing after the manufacturing of the data processor integrated circuit. In the preferred form, a user has the choice of making test mode access solely a software function being executed by CPU 11 or another master of IMB 12, a combination hardware and software function or making access to a test mode completely impossible in a user's system. The test mode may be enabled between normal system functions or as a part of a repair test. When the conditions for test mode are no longer satisfied, a system which is performing a user self test during a primary task may abort the self test and immediately return to a normal mode and a known state via reset. The present invention also provides security from runaway software as a result of the write once nature of the ETM bit.

While the present invention has been shown and described with reference to a particular embodiment thereof, various modifications and changes thereto will be apparent to those skilled in the art and are within the spirit and scope of the present invention.

We claim:

1. In a data processor which can be selectively placed in a test mode of operation by test mode circuitry of the data processor, said test mode circuitry comprising:
   an integrated circuit terminal for receiving a predetermined external test signal required to be asserted in order to enter the test mode of operation; and
   means for providing a test mode signal for use by the data processor, the test mode signal controlling when the test mode of operation is entered, in response to both the external test signal and a control signal provided by the data processor, said test mode signal only being provided a first time that the control signal is asserted by the data processor between successive reset operations of the data processor and only if said external signal is also asserted, said means otherwise preventing the mode signal from being provided by the mode circuitry at least until a subsequent reset operation if during a first assertion of the control signal the external test signal is not also being concurrently asserted.

2. In the data processor of claim 1 wherein a reset signal for resetting the data processor occurs in response to either: (1) negating said external test signal while said test mode signal assumes an active logic state; or (2) generation of a reset request signal by the data processor if said test mode signal never assumes an active logic state.

3. In the data processor of claim 1 wherein the terminal is an external pin of an integrated circuit package containing said data processor and is connected to a clocked storage device for providing an internal test signal which is logically combined with the control signal to generate the test mode signal.

4. In the data processor of claim 1 wherein said means for providing the test mode signal further comprise logic circuitry for providing the test mode signal as a single register bit having a predetermined logic state when the test mode signal is asserted.

5. A method for selectively placing a data processor in a test mode of operation, comprising the steps of:
   receiving a test signal external to said data processor having a predetermined logic value required to enter the test mode of operation; and
   providing a test mode signal in response to a control signal provided by the data processor and the external test signal, said test mode signal controlling when the test mode of operation is entered, the test mode signal only being provided a first time that the control signal is asserted by the data processor between successive reset operations of the data processor and only if said external signal is also asserted, the test mode signal otherwise not being provided at least until after a subsequent reset operation if during a first assertion of the control signal the external test signal is not also being concurrently asserted.

6. The method of claim 5 further comprising the step of:

providing the test mode signal as a single register bit having a predetermined logic state when the test mode signal is asserted.

7. The method of claim 5 further comprising the step of:
generating a reset signal to initiate a reset operation in response to either: (1) negating said external test signal while said test mode signal assumes an active logic state; or (2) generation of a reset request signal by the data processor if said test mode signal never assumes an active logic state.

8. In a data processor, a test mode circuit for providing an enable signal to enable a test mode of operation in the data processor, comprising:
first means for providing the enable signal in response to receiving both an external test mode signal at an input terminal of the data processor and a control signal provided by the data processor, said first means comprising a register and allowing the register to be written to only once between successive reset signals of the data processor, said first means providing the enable signal only a first time that the control signal is asserted between successive reset signals and only if said external signal is also asserted, said first means otherwise preventing the test mode signal from being provided; and
second means coupled to the first means for selectively providing the data processor with a reset request signal, informing the data processor that a reset must occur before the test mode of operation may be enabled, the reset request signal being provided in response to either: (1) negating said external test mode signal while said enable signal assumes an active logic state; or (2) generation of a reset request signal by the data processor if said enable signal never assumes an active logic state.

9. The test mode circuit of claim 8 wherein said first means further comprises a logic circuit for logically ANDing the external test mode signal and the control signal to provide a write control signal which is connected to the register.

* * * * *